(12) United States Patent
Strauss et al.

(10) Patent No.: US 9,178,332 B2
(45) Date of Patent: Nov. 3, 2015

(54) HOUSING FOR AN OPTOELECTRONIC SEMICONDUCTOR COMPONENT AND METHOD FOR PRODUCING SUCH A HOUSING

(75) Inventors: Uwe Strauss, Bad Abbach (DE); Markus Arzberger, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/825,290

(22) PCT Filed: Sep. 13, 2011

(86) PCT No.: PCT/EP2011/065842
§ 371 (c)(1),
(2), (4) Date: Jun. 18, 2013

(87) PCT Pub. No.: WO2012/038303
PCT Pub. Date: Mar. 29, 2012

(65) Prior Publication Data
US 2013/0266035 A1    Oct. 10, 2013

(30) Foreign Application Priority Data

Sep. 20, 2010    (DE) .................... 10 2010 046 088

(51) Int. Cl.
*H01L 23/495* (2006.01)
*H01S 5/024* (2006.01)
(Continued)

(52) U.S. Cl.
CPC .............. *H01S 5/024* (2013.01); *H01L 23/495* (2013.01); *H01S 5/02244* (2013.01); *H01L 33/62* (2013.01); *H01L 2224/48091* (2013.01); *H01L 2224/48465* (2013.01); *H01S 5/02216* (2013.01); *H01S 5/02276* (2013.01); *H01S 5/02288* (2013.01); *H01S 5/02296* (2013.01); *H01S 5/02476* (2013.01)

(58) Field of Classification Search
CPC . H01S 5/024; H01S 5/02244; H01S 5/02276; H01S 5/02288; H01S 5/02296; H01S 5/02476; H01L 23/495; H01L 33/62; H01L 2224/48465; H01L 2224/48091; H01L 2924/00014; H01L 2924/00
USPC ................ 257/677, 675, 773, 774, 698, 696; 372/44, 44.01; 438/121, 26
See application file for complete search history.

(56) References Cited

U.S. PATENT DOCUMENTS

| 5,557,116 | A | | 9/1996 | Masui et al. |
| 5,557,118 | A | * | 9/1996 | Hashimoto ................... 257/197 |
| 5,606,182 | A | | 2/1997 | Yoshida et al. |

(Continued)

FOREIGN PATENT DOCUMENTS

| CN | 1093837 A | 10/1994 |
| CN | 2255682 Y | 6/1997 |

(Continued)

*Primary Examiner* — Alexander Oscar Williams
(74) *Attorney, Agent, or Firm* — Slater & Matsil, L.L.P.

(57) ABSTRACT

A housing for an optoelectronic semiconductor component includes a housing body having a mounting plane and a leadframe with a first connection conductor and a second connection conductor. The housing body deforms the leadframe in some regions. The leadframe has a main extension plane which extends obliquely or perpendicularly with respect to the mounting plane. A semiconductor component having such a housing and a semiconductor chip and a method for producing a housing are also disclosed.

13 Claims, 8 Drawing Sheets

(51) Int. Cl.
*H01L 33/62* (2010.01)
*H01S 5/022* (2006.01)

(56) References Cited

U.S. PATENT DOCUMENTS

| | | | |
|---|---|---|---|
| 5,825,054 A * | 10/1998 | Lee et al. | 257/98 |
| 5,993,075 A | 11/1999 | Huang et al. | |
| 2003/0012036 A1 | 1/2003 | Uemura et al. | |
| 2003/0231673 A1 | 12/2003 | Uchida et al. | |
| 2004/0032888 A1 | 2/2004 | Ferstl | |
| 2005/0072985 A1 | 4/2005 | Yamamoto | |
| 2005/0194601 A1 | 9/2005 | Suenaga | |
| 2007/0228535 A1 | 10/2007 | Fujino et al. | |
| 2009/0103581 A1 | 4/2009 | Bessho | |
| 2010/0128750 A1 | 5/2010 | Fukuda et al. | |

FOREIGN PATENT DOCUMENTS

| | | | |
|---|---|---|---|
| DE | 102 60 432 A1 | | 7/2004 |
| DE | 10 2007 014 685 A1 | | 10/2007 |
| EP | 0 607 700 A2 | | 7/1994 |
| EP | 0 658 933 A2 | | 6/1995 |
| JP | 5121841 A | | 5/1993 |
| JP | 2002-353514 A | * | 2/2002 |
| JP | 2002-261332 A | * | 9/2002 |
| JP | 2002-353514 A | | 12/2002 |

\* cited by examiner

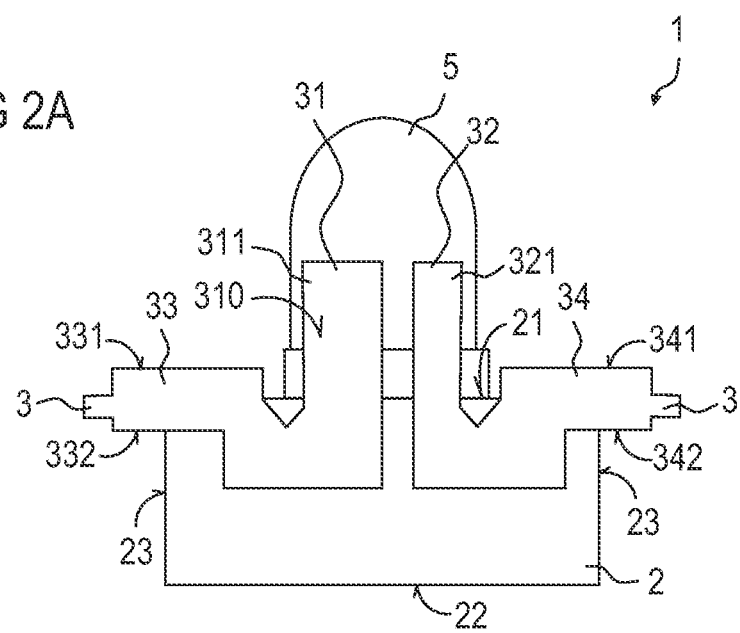

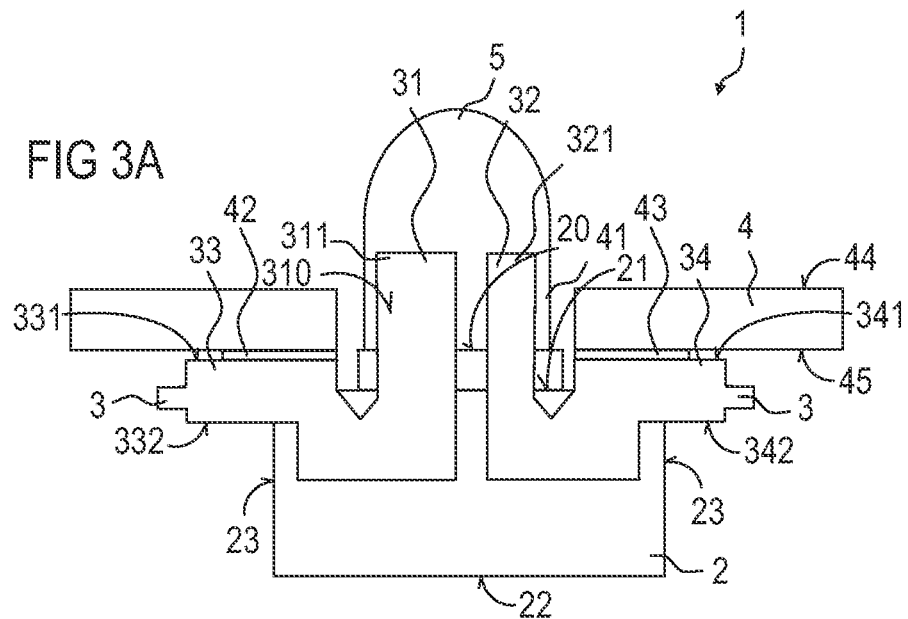
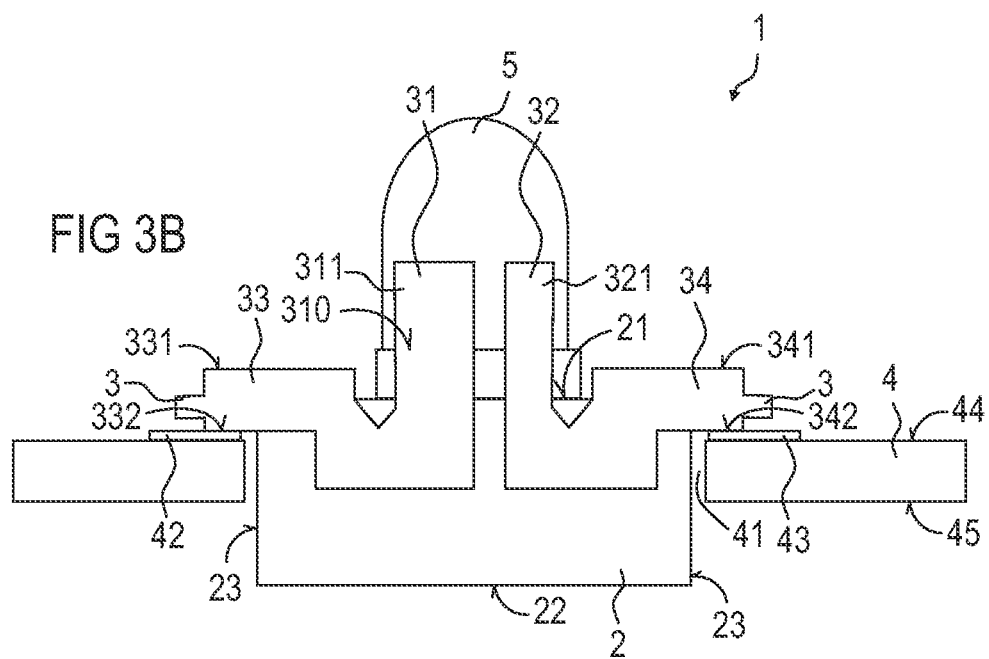

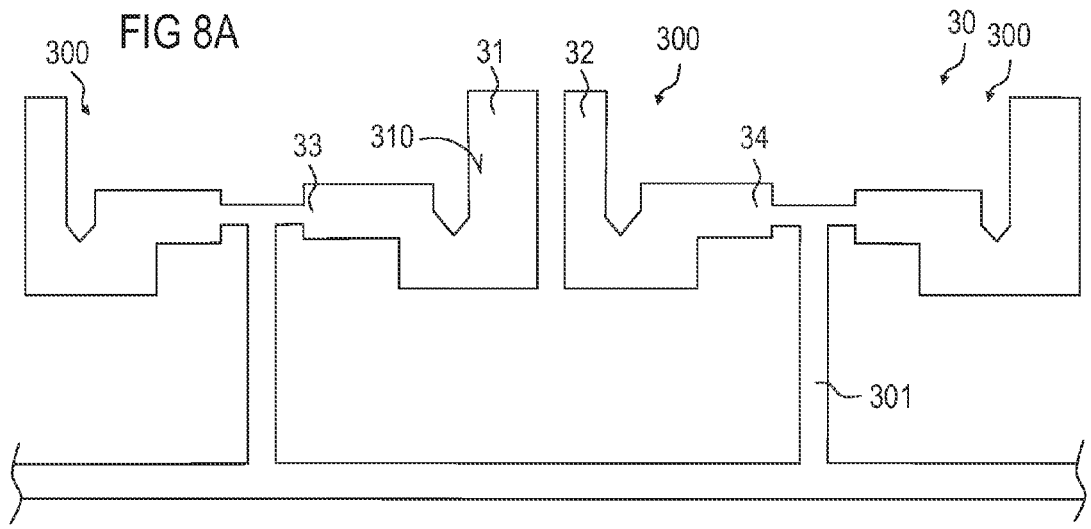
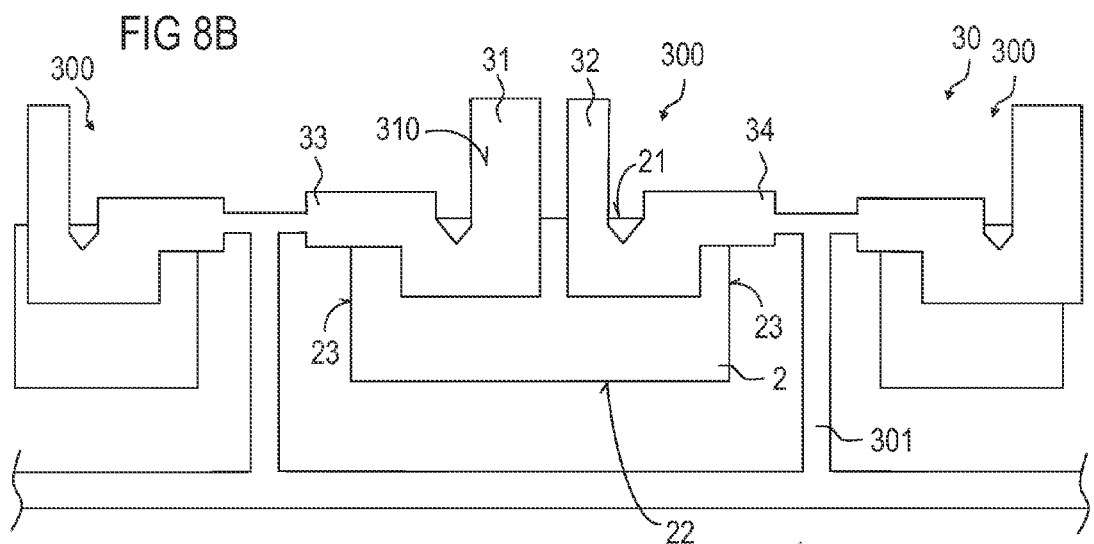
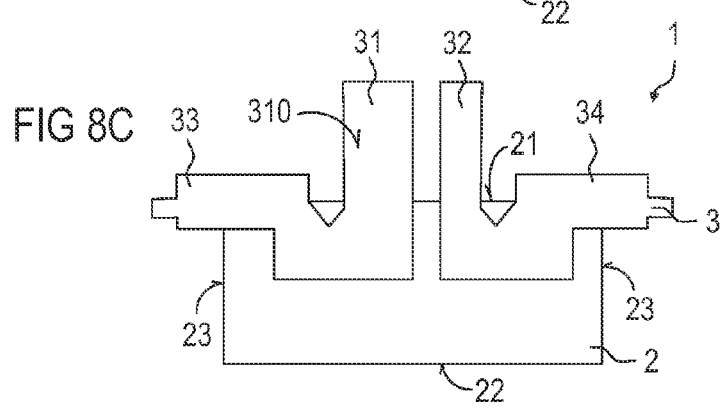

HOUSING FOR AN OPTOELECTRONIC SEMICONDUCTOR COMPONENT AND METHOD FOR PRODUCING SUCH A HOUSING

This patent application is a national phase filing under section 371 of PCT/EP2011/065842, filed Sep. 13, 2011, which claims the priority of German patent application 10 2010 046 088.5, filed Sep. 20, 2010, each of which is incorporated herein by reference in its entirety.

TECHNICAL FIELD

The present application relates to a housing, a semiconductor component comprising such a housing, and a method for producing a housing.

BACKGROUND

For semiconductor laser diodes having waste heat powers into the watts range, so-called TO housings, for example TO56, TO38 or TO9 housings, are often used. On account of the comparatively complicated construction of these metal housings, however, the latter are too complicated and cost-intensive for uses in the consumer market.

SUMMARY OF THE INVENTION

Embodiments of the invention specify a housing for an optoelectronic semiconductor component which can be produced simply and cost-effectively and at the same time ensures good heat dissipation from the radiation-generating semiconductor chip. Further embodiments specify a method by which a housing can be produced simply and reliably.

In accordance with one embodiment, a housing for an optoelectronic semiconductor component comprises a housing body having a mounting plane and a leadframe having a first connection conductor and a second connection conductor. The housing body molds around the leadframe in regions. The leadframe has a main extension plane running obliquely or perpendicularly with respect to the mounting plane.

A mounting plane is generally understood to mean a plane which is spanned by partial regions of a surface of the housing body, wherein the mounting plane, upon the housing body being fixed to a connection carrier, for instance a circuit board, runs parallel or substantially parallel, for instance with a tilt of at most 10°, with respect to the connection carrier. The housing body can be embodied such that it bears on the connection carrier over a large area or else only at certain points, for example in the form of a tripod or multipod.

As a result of the mounting of the semiconductor chip at the prefabricated housing, in particular at the first connection conductor, a semiconductor component distinguished by simple and cost-effective production is realized, wherein at the same time waste heat generated in the semiconductor chip during operation can be efficiently dissipated.

The housing body preferably has a first main face, wherein the first connection conductor furthermore preferably projects from the housing body on the part of the first main face. A region of the first connection conductor which projects from the housing body on the part of the first main face is preferably provided for fixing a semiconductor chip.

The semiconductor chip can therefore be mounted in the prefabricated housing body. The housing body can adjoin the semiconductor chip in regions. In this case, however, the housing body is not molded onto the semiconductor chip. In other words, the semiconductor chip is not, or at least is not completely, embedded into a molding compound for the housing body.

The first connection conductor and the second connection conductor furthermore preferably project from the housing body on the part of the first main face. Making electrical contact with the semiconductor chip is thus simplified.

In one preferred configuration, the first main face runs along the mounting plane. That is to say that the first main face runs in the mounting plane or parallel thereto. In this case, the main extension plane of the leadframe runs at the same angle with respect to the mounting plane as with respect to the first main face. Furthermore, in this case, the housing body can be mounted at a connection carrier in such a way that the first main face runs parallel to the connection carrier.

In case of doubt, a main extension plane of the leadframe is understood to mean an area which runs parallel to a surface of the leadframe and which is perpendicular to a direction along which the extent of the leadframe is the smallest. By way of example, in the case of a leadframe produced from a metal sheet, the thickness of the metal sheet typically determines the smallest extent of the leadframe. The main extension plane runs along the surface of the metal sheet. In the case of a regionally curved surface, therefore, the main extension plane also runs in a correspondingly regionally curved manner.

In one preferred configuration, the main extension plane of the leadframe is embodied completely in planar fashion. That is to say that the leadframe is free of kinks or bends. In other words, the connection conductors can be produced in a simple manner during production by structuring from a basic material present in planar form, for example, from an unstructured, planar metal sheet. Additional production steps for bending or kinking the basic material can therefore be dispensed with.

The housing is preferably embodied in such a way that the semiconductor component is surface-mountable.

The housing body furthermore preferably has a further mounting plane in addition to the mounting plane. The housing can thus be fixed in different ways. Preferably, the mounting plane and the further mounting plane run parallel to one another. In this case, the emission direction of the radiation of the semiconductor chip relative to the connection carrier can be independent of whether the first or the second mounting plane is used for the fixing of the housing.

In one preferred development, electrical contact can be made externally with the first connection conductor and the second connection conductor between the mounting plane and the further mounting plane. The production of an electrically conductive connection between the connection carrier and the connection conductors independently of the mounting plane used is thus simplified more extensively.

In one preferred configuration, a side face of the first connection conductor which runs along the main extension plane is provided for the fixing of the semiconductor chip. In the case of a semiconductor chip embodied as an edge emitting laser, therefore, the emission direction with regard to the connection carrier is predefined by the orientation of the first connection conductor relative to the mounting plane of the housing body.

In one preferred configuration, the housing body is a plastic body molded onto the leadframe, in particular onto the first connection conductor and onto the second connection conductor. Such a housing body can be produced particularly simply and cost-effectively by means of a molding method. A molding method is generally understood to mean a method by which a molding compound can be configured in accordance with a predefined form, for example, by means of molding, injection molding or transfer molding.

On a side situated opposite the first main face, the housing body is preferably delimited by a, preferably planar, second main face, which furthermore preferably runs parallel to the first main face. The first main face and/or the second main face can form the mounting plane of the housing body.

In a further preferred configuration, the first connection conductor and the second connection conductor are spaced apart from one another in a direction running in the main extension plane.

In one preferred configuration, the leadframe, preferably the first connection conductor and the second connection conductor, have a thickness of at least 0.5 mm, particularly preferably a thickness of at least 1 mm. This ensures in a simple manner that heat loss arising in a semiconductor chip arranged on the first connection conductor can be dissipated efficiently from the semiconductor chip. The thickness can be set by the thickness of the basic material for the connection conductors during the production of the housing.

The first connection conductor furthermore preferably has, at least in regions, in particular in the region projecting from the housing body on the part of the first main face, a cross section of at least 1 mm$^2$. Efficient heat dissipation from the semiconductor chip is thus ensured even for semiconductor chips which generate waste heat powers of 0.1 W or more during operation. In order to improve the heat dissipation, in particular the cross section of the first connection conductor on the part of the first main face of the housing body can be greater than the cross section of the second connection conductor.

In a further preferred configuration, the housing body has at least one supporting element having a bearing face. The mounting plane can be formed by means of the bearing face. Preferably, the housing body has in each case at least one bearing face on two opposite sides of the main extension plane. The bearing faces can be formed by one continuous supporting element or by two supporting elements spaced apart from one another. During the mounting of the housing, the housing, in particular before the formation of an electrically conductive connection of the connection conductors to the connection carrier, can bear on at least one bearing face of the at least one supporting element. The risk of the housing tilting during mounting is thus reduced.

Furthermore, the supporting element can form a second bearing face on the side situated opposite the first bearing face. In particular, the mounting plane can be formed by means of the first bearing face and the further mounting plane can be formed by means of the second bearing face, or vice versa.

In a further preferred configuration, the first connection conductor and the second connection conductor in each case form an external contact region provided for making electrical contact with the housing externally. In particular, a region of the first connection conductor and/or of the second connection conductor which projects from the housing body in a lateral direction, that is to say in a direction running along the mounting plane, can form one of the external contact regions.

Preferably the contact region extends in a vertical direction running perpendicularly to the mounting plane in each case between a first side face and a second side face.

In one preferred development, the mounting plane is formed by means of the bearing face of the supporting element, and the bearing face, in a vertical direction running perpendicularly to the mounting plane, is embodied in a manner offset with respect to a first side face of the leadframe which is closest to the bearing face and which in particular runs parallel to the bearing face. In particular, the first side face can be arranged in a manner offset with respect to the first bearing face of the supporting element. Alternatively or additionally, the second side face can be arranged in a manner offset with respect to the second bearing face of the supporting element.

In other words, the side face of one of the connection conductors in the contact region and the bearing face that is closest in a vertical direction do not form a common plane. The offset is preferably of a magnitude such that between the connection carrier and the closest side face of the contact region, that is to say depending on the positioning of the housing relative to the connection carrier between the connection carrier and the first side face or between the connection carrier and the second side face, a connecting layer for making electrical contact, for example, a solder or an electrically conductive adhesive, can be formed if the supporting element bears on the connection carrier. Preferably, the offset is between 5 µm and 50 µm inclusive.

In one development, the housing is embodied such that electrical contact can be made with the contact region at the first side face or at the second side face. Thus, in a simple manner, a housing is realized with which electrical contact can be made in different ways, for example, from a side facing the second main face or a side facing away from the second main face.

In one preferred configuration, at least one of the connection conductors has a, for example, pin-like, continuation. The continuation is preferably provided for projecting into a recess of a connection carrier when the housing is mounted on the connection carrier. The continuation preferably has a main extension direction running in the vertical direction. The mounting accuracy of the housing can be increased by means of the continuation. The continuation can furthermore also be provided for making electrical contact with the connection conductor.

In one preferred development, the housing is embodied in such a way that electrical contact can be made with the first connection conductor and the second connection conductor by means of the external contact regions and/or by means of the continuation. In other words, therefore, electrical contact can be made with the housing in various ways, depending on the purpose of use, such that the diversity of the housing is increased in a simple manner.

In one preferred configuration, at least one of the connection conductors has a positioning element for an optical element. The positioning element preferably runs in the main extension plane of the leadframe. Thus, the optical element can be positioned by means of the positioning element in a reliable manner relative to the semiconductor chip arranged on the first connection conductor. Preferably, the optical element is embodied such that it can be fixed to the positioning element, for example, by means of a plug connection.

In a method for producing a housing for a semiconductor component, in accordance with one embodiment, a connection conductor assemblage having a plurality of connection conductor regions is provided. A molding compound is molded around the connection conductor regions in such a way that a housing body emerges from the molding compound in each connection conductor region, wherein the connection conductor regions project from the housing body in each case on the part of a first main face of the housing body in a main extension plane of the connection conductor assemblage. The connection conductor assemblage is severed between adjacent connection conductor regions, such that each housing comprises a housing body and a first connection conductor and a second connection conductor emerge from each connection conductor region.

The connection conductors can emerge from a planar connection conductor assemblage. In particular, the connection conductor assemblage can be formed by structuring a planar metal sheet, for example, mechanically, for instance, by means of stamping or milling, or chemically, for instance, by means of etching. Alternatively, it is also conceivable to form the connection conductor assemblage by means of a molding method, such that subsequent structuring is not required.

Preferably, the connection conductor assemblage is provided in continuous form, wherein an interspace is formed between the regions from which the connection conductors emerge, said interspace being filled with the molding compound during the formation of the housing body.

In one preferred configuration, the connection conductor region penetrates through the housing body at at least three locations spaced apart from one another. Preferably, the connection conductor region projects from the housing body from opposite sides in particular in a direction running parallel to the first main face in the main extension plane of the connection conductor assemblage.

In a further preferred configuration, a bridging region of the connection conductor assemblage is in each case assigned to the connection conductor regions provided. The bridging region connects the first connection conductor and the second connection conductor to one another before the severing. During the severing of the connection conductor assemblage, the bridging regions are separated from the connection conductor regions. A continuous connection conductor assemblage can be formed in a simplified manner by means of the bridging regions. After molding around the connection conductor assemblage, the connection conductors of the respective housing are mechanically stably connected to one another by means of the housing body, such that the assigned bridging region is no longer required.

The method described is particularly suitable for producing a housing described further above. Features implemented in connection with the housing can therefore also be used for the method, and vice versa.

BRIEF DESCRIPTION OF THE DRAWINGS

Further features, configurations and expediencies will become apparent from the following description of the exemplary embodiments in conjunction with the figures.

FIGS. 2A to 2C show a second exemplary embodiment of a housing in schematic side view (FIG. 2B), associated sectional view (FIG. 2A) and in plan view (FIG. 2C);

FIGS. 3A and 3B show two mounting variants for a housing in accordance with the second exemplary embodiment in schematic sectional view;

FIGS. 8A to 8C show an exemplary embodiment of a method for producing a housing on the basis of intermediate steps each illustrated in schematic sectional view.

Elements that are identical, are of identical type or that act identically are provided with the same reference signs in the figures.

The figures and the size relationships of the elements illustrated in the figures among one another should not be regarded as to scale. Rather, individual elements may be illustrated with an exaggerated size in order to enable better illustration and/or in order to afford a better understanding.

DETAILED DESCRIPTION OF ILLUSTRATIVE EMBODIMENTS

Figure 1A:
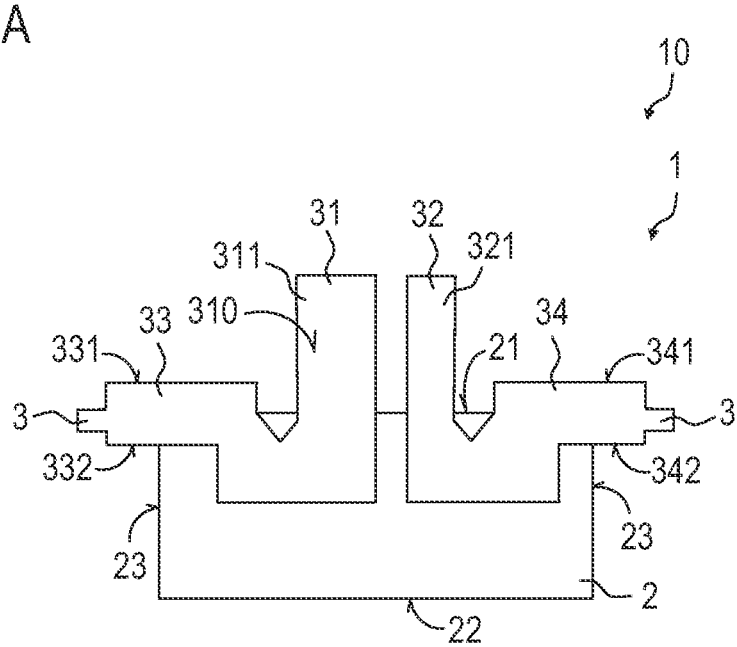
FIGS. 1A and 1B show a first exemplary embodiment of a housing of a semiconductor component in schematic side view (FIG. 1B) and associated sectional view (FIG. 1A)
Figure 1B:
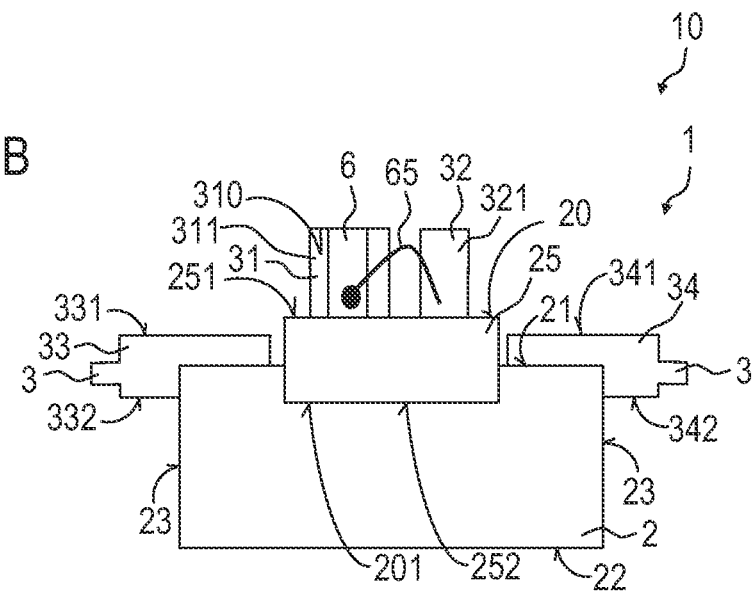

FIGS. 1A and 1B schematically illustrate a first exemplary embodiment of a housing 1 for a surface-mountable semiconductor component 10.

The housing 1 comprises a first connection conductor 31 and a second connection conductor 32. The connection conductors form a leadframe 3, onto which a housing body 2 is molded. The housing body is produced from a plastic. The housing body 2 extends in a vertical direction in regions between a first main face 21 and a second main face 22. A region 311 of the first connection conductor 31 and a region 321 of the second connection conductor 32 in each case project from the first main face 21 of the housing body 2. The projecting regions of the connection conductors run parallel to one another. The projecting regions are provided for making electrical contact with a semiconductor chip.

The leadframe 3 extends in planar fashion along a main extension plane. The connection conductors 31, 32 therefore run in a common plane. The main extension plane runs perpendicularly to the first main face 21.

As shown in FIG. 1B, an optoelectronic semiconductor chip 6, which can be embodied as an edge emitting laser chip, for example, is arranged in the prefabricated housing 1. The semiconductor chip is fixed to the first connection conductor 31 and is electrically conductively connected thereto, for example, by means of a solder or an electrically conductive adhesive. The second connection conductor 32 is electrically conductively connected to the semiconductor chip 6 by means of a connecting line 65, for example, a bonding wire.

In the exemplary embodiment shown, the semiconductor chip 6 is fixed to a side face 310 of the first connection conductor 31 which runs along the main extension plane of the leadframe 3. In the case of a semiconductor chip 6 embodied as an edge emitting semiconductor laser, therefore, the emission takes place perpendicularly to the first main face of the housing body 2, that is to say in the vertical direction.

Therefore, the radiation does not have to pass through the housing body 2, and so the housing body 2 can also be embodied as non-transmissive to the radiation to be generated in the semiconductor chip 6.

In the main extension plane of the leadframe 3, the first connection conductor 31 is spaced apart from the second connection conductor 32. The connection conductors are thus electrically insulated from one another in the housing 1 and are mechanically stably connected to one another merely via the housing body 2.

In a lateral direction running perpendicularly to the vertical direction, the housing body 2 is delimited by a side face 23. The connection conductors 31, 32 project from the housing body 2 in a lateral direction, wherein the projecting part of the first connection conductor 31 forms a first external contact region 33 and that part of the second connection conductor 32 which projects from the housing body forms a second external contact region 34. As a result of an external electrical voltage being applied between the contact regions, charge carriers can be injected into the semiconductor chip 6 from different sides and recombine there with the emission of radiation.

The semiconductor chip 6 preferably contains a III-V compound semiconductor material. III-V semiconductor materials are particularly suitable for generating radiation in the ultraviolet ($Al_xIn_yGa_{1-x-y}N$) through the visible ($Al_xIn_yGa_{1-x-y}N$, in particular for blue to green radiation, or $Al_xIn_yGa_{1-x-y}P$, in particular for yellow to red radiation), to the infrared ($Al_xIn_yGa_{1-x-y}As$) spectral range. Here $0 \leq x \leq 1$, $0 \leq y \leq 1$ and $x+y \leq 1$ hold true in each case, in particular where $x \neq 1$, $y \neq 1$, $x \neq 0$ and/or $y \neq 0$.

In a vertical direction, the first contact region 33 and the second contact region 34 extend between a first side face 331 and 341, respectively, and a second side face 332 and 342, respectively.

The contact regions 33, 34 are embodied in such a way that the housing 1 can be fixed in different orientations to a connection carrier, for instance a rigid or flexible circuit board, and can be electrically conductively connected thereto. This will be explained in greater detail in connection with FIGS. 3A and 3B.

The housing body 2 furthermore has a respective supporting element 25 on both sides of the main extension plane in a plan view of the housing. The supporting element 25 extends out across the remaining part of the housing body in a direction running perpendicularly to the main extension plane of the leadframe 3. In a vertical direction, the supporting element 25 extends in each case between a first bearing face 251 facing away from the second main face 22 and a second bearing face 252 facing the second main face 22.

A mounting plane 20 is formed by means of the first bearing face 251. A further mounting plane 201 is correspondingly formed by means of the second bearing face 252. The mounting plane 20 and the further mounting plane 201 run parallel to one another and furthermore parallel to the first main face 21 of the housing body 2.

The supporting element 25 is provided for mechanically stabilizing the housing 1 when the semiconductor component 10 is mounted on a connection carrier, in particular before the semiconductor component 10 is connected to the connection carrier at the connection conductors 31, 32.

For producing the housing 1, the connection conductors 31, 32 can be formed from a basic material present in planar form, for example, a metal sheet, for instance a copper sheet or a sheet composed of a copper-containing alloy. Bending or kinking of the leadframe 3 can be dispensed with during production.

In contrast to a conventional housing comprising a leadframe, the connection conductors 31, 32 of the leadframe 3 run in one plane in the housing 1 described, wherein the plane runs perpendicularly or at least obliquely with respect to a mounting plane of the housing and thus perpendicularly or at least obliquely with respect to the connection carrier on which the housing is arranged.

In a departure from the exemplary embodiment described, the main extension plane of the connection conductors 31, 32 need not necessarily be perpendicular to the first main face 21 or to the mounting planes 20, 201 of the housing body 2. Depending on the desired emission direction of the semiconductor component, a different angle of the plane relative to the main face 21 or to the mounting planes can also be expedient.

The thickness of the first connection conductor 31 and of the second connection conductor 32, that is to say the extent perpendicular to the main extension plane of the connection conductors, is preferably at least 0.5 mm, particularly preferably at least 1.0 mm. This ensures that waste heat generated during the operation of the semiconductor component 10 in the semiconductor chip 6 can be efficiently dissipated via the first connection conductor 31. The housing is thus particularly suitable for semiconductor chips in which a comparatively high thermal power has to be dissipated during operation, for example, 0.1 W or more. In particular, the housing is suitable for semiconductor chips provided for generating coherent, incoherent or partly coherent radiation.

A cross section of the first connection conductor 31 is preferably at least 1 mm², particularly preferably at least 2 mm². The cross section of the second connection conductor 32 can also be less than the cross section of the first connection conductor 31, since the latter merely serves for making electrical contact with the semiconductor chip 6. The extent of the leadframe 3 in a lateral direction can thus be minimalized with the functionality remaining the same.

Figure 2B:
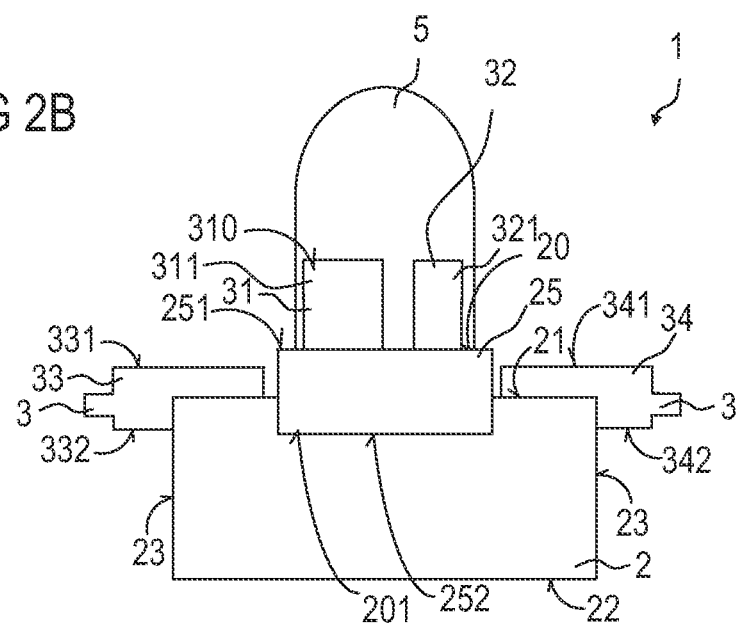
Figure 2C:
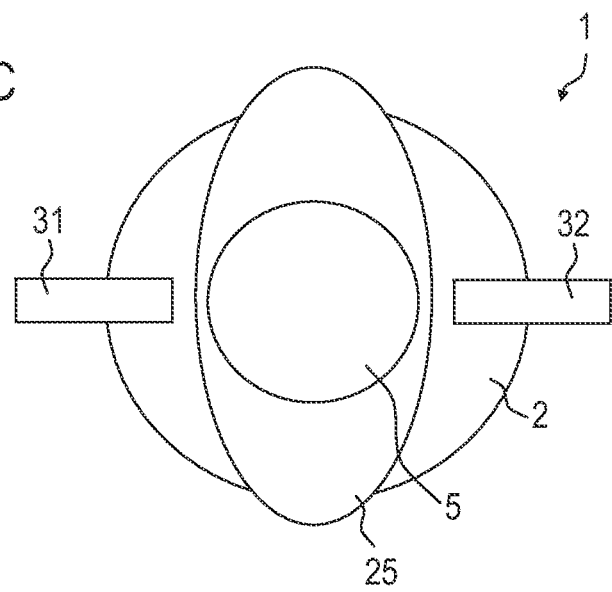

A second exemplary embodiment of a housing is illustrated schematically in sectional view, in side view and in plan view in FIGS. 2A to 2C, respectively. This second exemplary embodiment substantially corresponds to the first exemplary embodiment described in connection with FIGS. 1A and 1B. In contrast thereto, the housing 1 has a cap 5. The cap 5 surrounds those parts of the connection conductors 31, 32 which project from the first main face 21 of the housing body 2. The cap 5 is expediently embodied such that it is transparent or at least translucent to the radiation to be generated in the semiconductor component. By way of example, the cap 5 can be produced from a plastic or a glass. A semiconductor chip fixed on the first connection conductor 31 can be protected against external influences, such as mechanical loading, moisture or dust, by means of the cap 5. An encapsulation formed by means of a potting compound for the semiconductor chip can be dispensed with.

As illustrated in FIG. 2C, the housing body 2 has a circular basic shape in plan view. During the production of the housing body from a molding compound, such a housing shape is distinguished by particularly good releasability from the mold. In a departure therefrom, however, other curved, for example elliptical, or else polygonal basic shapes can also be used.

In the exemplary embodiment shown, the supporting element 25 is embodied as a continuous elliptical element through which the main extension plane of the leadframe 3 runs and which forms the mounting plane 20 and also the further mounting plane 201. In a departure therefrom, as in the first exemplary embodiment, two or more separate supporting elements can also be provided. Furthermore, it is also conceivable to form the housing body only with one supporting element.

FIGS. 3A and 3B illustrate different mounting possibilities for a housing embodied as described in connection with FIGS. 2A to 2C.

In the case of the variant illustrated in FIG. 3A, a connection carrier 4 has a cutout 41. The connection carrier has a first main face 44 and a second main face 45 situated opposite the first main face 44. In the variant illustrated in FIG. 3A, the connection carrier 4 has a first connection area 42 and a second connection area 43 on the second main face 45. The first connection area 42 and the second connection area 43 are connected to the first connection conductor 31 and the second connection conductor 32, respectively, by means of a connecting layer, for instance, a solder or an electrically conductive adhesive (not explicitly illustrated).

The first side face 331 of the first connection conductor 31 and the first side face 341 of the contact region of the second connection conductor 32 are respectively provided for making electrical contact with the connection areas. In other words, those side faces of the leadframe 3 which arise during the structuring of the leadframe, for instance by stamping, are provided for making contact. Said side faces run perpendicularly or at least substantially perpendicularly to the side face 310 provided for the fixing of the semiconductor chip.

The first bearing face 251 forms the mounting face 20. The first bearing face 251 of the supporting element 25 is offset relative to the first side faces 331, 341 of the contact regions 33, 34 of the connection conductors 31, 32, such that the housing 2 bears on the first bearing face 251 during mounting and the connecting means can be formed between the connection carrier 4 and the connection conductors 31, 32. Preferably, the offset is between 5 and 50 μm inclusive. In a departure therefrom, the bearing faces of the supporting element or of the supporting elements can, however, also be formed flush with the respectively closest side faces of the contact region.

In this exemplary embodiment, only the regions 311, 312 of the connection conductors 31, 32 which project from the housing body 2 on the part of the first main face 21 extend through the cutout 41 of the connection carrier 4. The contact regions 33, 34 of the connection conductors 31 and 32, respectively, and the housing body 2 are arranged on the same side of the connection carrier 4.

In contrast to the first mounting variant illustrated in FIG. 3A, in the case of the second mounting variant illustrated in FIG. 3B, the connection areas 42, 43 are arranged on the first main face 44 of the connection carrier 4. The cutout 41 of the connection carrier 4 has a size such that the housing body 2 can be partly inserted into the cutout 41.

In this exemplary embodiment, the second side faces 332, 342 of the first contact region 33 and of the second contact region 34, respectively, facing the second main face 22 of the housing body 2 serve for making electrical contact with the first connection area 42 and the second connection area 43, respectively.

Furthermore, the housing body 2 bears on the connection carrier 4 with the second bearing face 252 of the supporting element 25, said second bearing face 252 facing the second main face 22 and forming the further mounting plane 201.

As shown by the figures, depending on the configuration of the connection carrier 4, therefore, the first side face or the second side face of the contact regions of the connection carriers can in each case serve for making electrical contact. A semiconductor component comprising such a housing body having at least two mounting planes is therefore distinguished by particularly high flexibility with regard to mounting. In the case of mounting planes arranged parallel to one another, the emission takes place independently of mounting relative to the connection carrier in the same direction. In a departure therefrom, however, the mounting plane and the further mounting plane can also be embodied in a manner tilted with respect to one another, such that the emission direction of the semiconductor chip can be set by the choice of the mounting plane.

Figure 4:
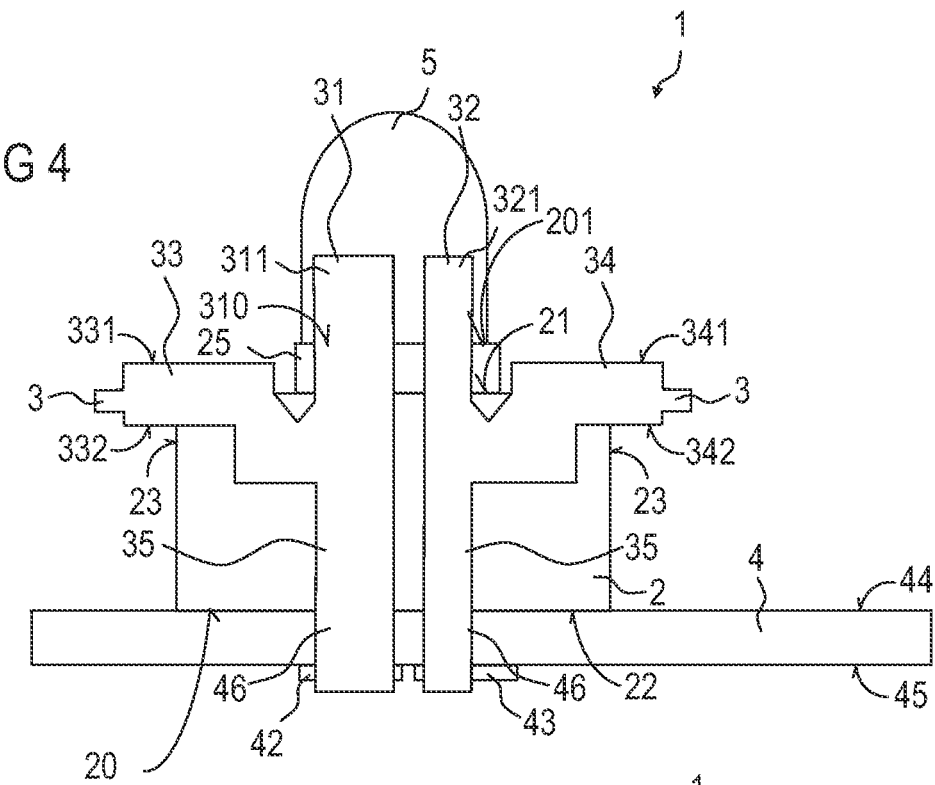
FIG. 4 shows a third exemplary embodiment of a housing in schematic sectional view.

A third exemplary embodiment of a housing is illustrated in schematic sectional view in FIG. 4. This third exemplary embodiment substantially corresponds to the second exemplary embodiment described in connection with FIGS. 2A to 2C. In contrast thereto, the connection conductors 31, 32 each have a continuation 35. The continuations 35 extend through the second main face 22 of the housing body 2.

The housing 1 is arranged on a connection carrier 4, wherein the connection carrier 4 has connection openings 46 through which the continuations 35 extend. In this exemplary embodiment, the second main face 22 of the housing body 2 serves as a mounting face 20 for arrangement on the connection carrier 4. The continuations run in the main extension plane of the leadframe 3.

The connection conductors 31, 32 are electrically conductively connected to the connection areas 42 and 43, respectively, on that side of the connection carrier 4 which faces away from the housing body 2.

In contrast to the second exemplary embodiment, therefore, electrical contact is made with the housing via the continuations 35, rather than via the contact regions 33, 34 extending laterally out of the housing body 2.

The leadframe 3 projects from the housing body 2 on the part of the first main face 21, on the part of the second main face 22 and in a lateral direction from the side face 23, that is to say in total at four locations spaced apart from one another, out of the housing body. The flexibility of the housing with regard to the mountability thereof can thus be increased more extensively.

In a departure from the type of mounting described, however, the housing in accordance with the exemplary embodiment illustrated can also be mounted as illustrated in FIG. 3B, such that the contact regions 33, 34 can serve for making electrical contact with the housing.

Figure 5:
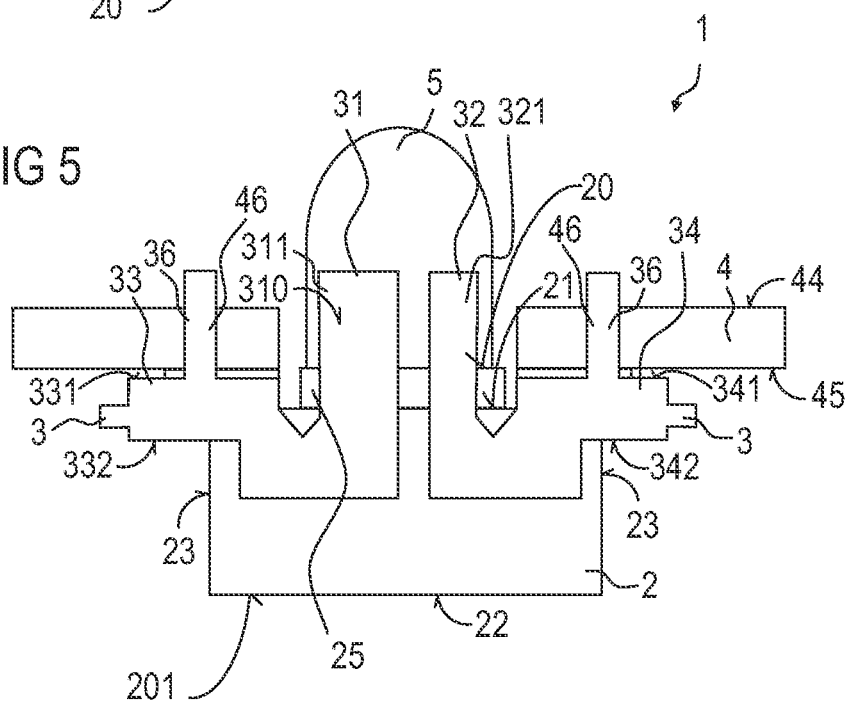
FIG. 5 shows a fourth exemplary embodiment of a housing in schematic sectional view.

A fourth exemplary embodiment of a housing is illustrated in schematic sectional view in FIG. 5. This fourth exemplary embodiment substantially corresponds to the second exemplary embodiment described in connection with FIGS. 2A to 2C.

In contrast thereto, the first connection conductor 31 and the second connection conductor 32 each have a positioning element 36 extending away from the first side faces 331, 341 of the first contact region 33 and of the second contact region 34, respectively.

In this case, the electrical contact-making takes place as described in connection with FIG. 3A.

The positioning elements 36 extend through connection openings 46 of the connection carrier 4.

In this exemplary embodiment, the positioning elements 36 do not serve for making electrical contact with the housing, but rather for accurately positioning the housing relative to the connection carrier 4.

In a departure from the exemplary embodiment described, however, the connection areas 42, 43 can also be formed on the first main face 44 of the connection carrier 4. In this case, the positioning elements can also be used for making electrical contact with the housing.

Figure 6:
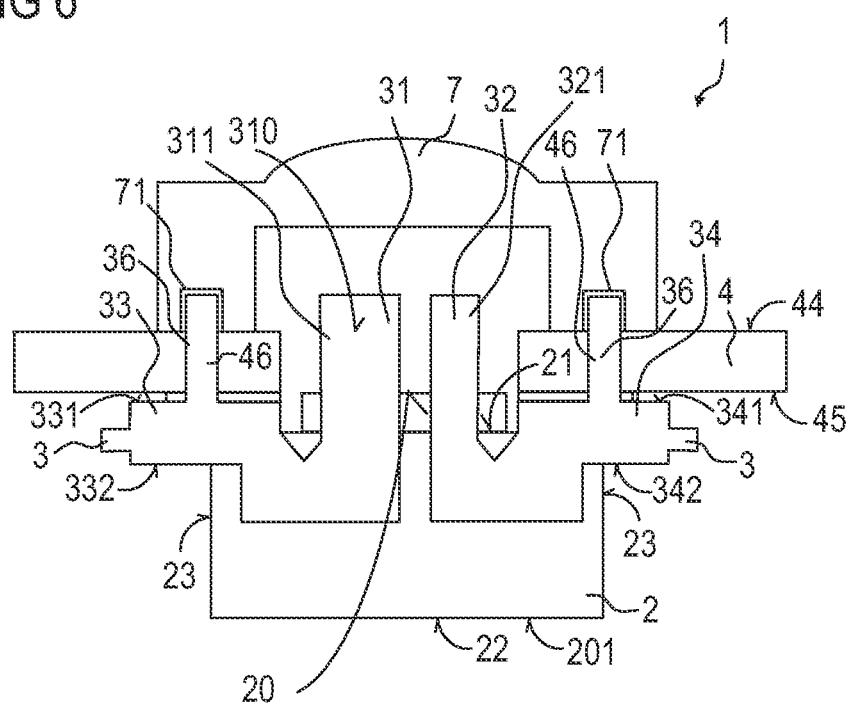
FIG. 6 shows a fifth exemplary embodiment of a housing in schematic sectional view.

A fifth exemplary embodiment of a housing is illustrated in schematic sectional view in FIG. 6. This fifth exemplary embodiment substantially corresponds to the fourth exemplary embodiment described in connection with FIG. 5. In contrast thereto, the housing has an optical element 7. The optical element 7 is arranged on that side of the connection carrier 4 which faces away from the housing body 2. The optical element 7 can furthermore fulfill the function of a cap, such that a separate cap can be dispensed with. The optical element 7 has recesses 71 into which the positioning elements 36 project. Since the positioning elements 36 together with the side face 310 form a common plane for the semiconductor chip, the optical element 7 can be accurately aligned relative to the semiconductor chip of the semiconductor component by means of the positioning elements 36.

The optical element 7 can be implemented in particular for the collimation of the radiation emitted by the semiconductor chip, in particular a collimation along the strongly divergent emission plane ("fast axis") or the weakly divergent emission plane ("slow axis"). Alternatively or supplementarily, the optical element 7 can be embodied as a diffractive optical unit.

Figure 7:
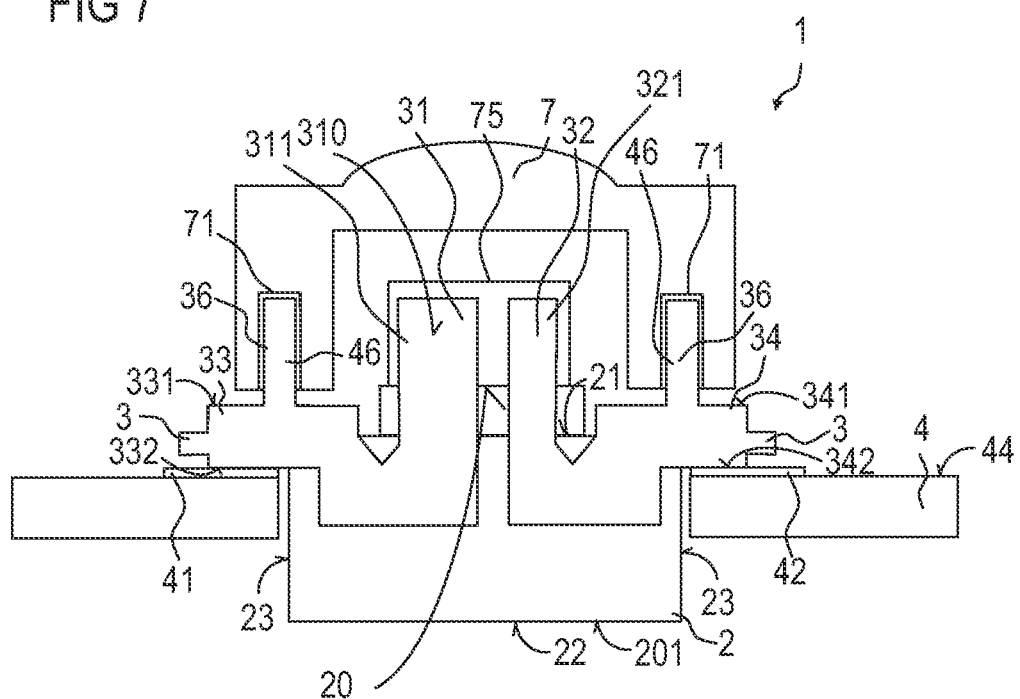
FIG. 7 shows a sixth exemplary embodiment of a housing in schematic sectional view.

A sixth exemplary embodiment of a housing 1 is schematically illustrated in FIG. 7. This sixth exemplary embodiment substantially corresponds to the fifth exemplary embodiment described in connection with FIG. 6. In contrast thereto, the housing 1 comprises a further optical element 75. The further optical element 75 is fixed to the housing body 2. By way of example, the further optical element 75 can serve for collimation along the strongly divergent emission plane and the optical element 7 can serve for collimation along the weakly divergent emission plane, or vice versa.

Furthermore, the housing is mounted as described in connection with FIG. 3B such that the housing body 2 extends in regions through the cutout 41 of the connection carrier 4. In this exemplary embodiment, therefore, the positioning elements 36 do not extend through the connection carrier 4, but rather serve only for positioning the optical element 7 relative to the connection conductors 31, 32 and thus relative to the mounted semiconductor chip.

FIGS. 8A to 8C show an exemplary embodiment of a method for producing a housing on the basis of intermediate steps illustrated schematically in sectional view. In this case, the production is shown by way of example for a housing embodied as described in connection with FIGS. 1A and 1B.

As illustrated in FIG. 8A, a connection conductor assemblage 30 having a plurality of connection conductor regions 300 is provided. A connection conductor region 300 is in each case provided for the production of a housing.

For simplified illustration, FIGS. 8A to 8C show only one connection conductor region 300 and partial regions of the respectively adjoining connection conductor regions.

The connection conductor assemblage 30 can be produced by structuring a metal sheet, for example, mechanically, for instance, by stamping or milling, or chemically, for instance, by etching. As an alternative to structuring from a metal sheet, the connection conductor assemblage can also be embodied in already structured form, for example, by means of molding.

The connection conductor assemblage 30 is present in planar form, such that bending or kinking of the starting material for the connection conductor assemblage can be dispensed with.

A bridging region 301 is in each case assigned to the connection conductor regions 300, by which bridging region the parts of the connection conductor region from which the first connection conductor 31 and the second connection conductor 32 emerge are mechanically stably connected to one another. By means of the bridging regions 301, the connection conductor assemblage 30 can be provided in continuous form.

In order to form the housing body 2, a molding compound is molded around the connection conductor regions in such a way that a housing body arises, wherein the connection conductor regions project from a first main face of the housing body 2 (FIG. 8B). Furthermore, the connection conductor regions 300 project from a side face 23 of the housing body at opposite sides. The bridging region 301 runs outside the housing body 2.

The housing body can be formed, for example, by means of molding, injection molding or transfer molding.

In order to complete the housing, the connection conductor assemblage 30 is severed between adjacent connection conductor regions 300. In the regions in which severing takes place, the connection conductor regions have a reduced cross section compared with the contact regions 33, 34, in particular, a reduced vertical extent. This ensures that burrs that arise during severing, during the mounting of the housing, do not impede the formation of a conductive connection between the side faces of the contact regions and the connection carrier.

The bridging regions 301 are completely separated during the singulation of the connection conductor assemblage 30, such that the first connection conductor 31 and the second connection conductor 32 are mechanically connected to one another only via the housing body 2 in the completed housing (FIG. 8C).

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or the exemplary embodiments.

The invention claimed is:

1. A housing for an optoelectronic semiconductor component, wherein the optoelectronic semiconductor component is configured to emit radiation, the housing comprising:
   a leadframe having a first connection conductor and a second connection conductor; and
   a housing body having a mounting plane, wherein the housing body molds around the leadframe in regions, wherein the housing body is non-transmissive to the radiation, wherein the leadframe has a main extension plane running obliquely or perpendicularly with respect to the mounting plane, and wherein a region of the first connection conductor which projects from the housing body in a direction running along the mounting plane is configured to be an external electrical contact region of the housing.

2. The housing according to claim 1, wherein the housing body has a first main face, wherein the first connection conductor and the second connection conductor project from the housing body on a portion of the first main face, and wherein the region of the first connection conductor that projects from the housing body on the portion of the first main face is configured to receive a semiconductor chip.

3. The housing according to claim 2, wherein the first main face runs along the mounting plane.

4. The housing according to claim 1, wherein a side face of the first connection conductor runs along the main extension plane and is configured to receive a semiconductor chip.

5. The housing according to claim 1, wherein the main extension plane of the leadframe is embodied completely in planar fashion.

6. The housing according to claim 1, wherein the leadframe has a thickness of at least 0.5 mm.

7. The housing according to claim 1, wherein the housing body comprises a supporting element having a bearing face, wherein the mounting plane is formed by way of the bearing face, and wherein the bearing face, in a vertical direction running perpendicularly to the mounting plane, is embodied in a manner offset with respect to a side face of the leadframe that is closest to the bearing face and that runs parallel to the bearing face.

8. The housing according to claim 1, wherein at least one of the connection conductors has a continuation provided for projecting into a recess of a connection carrier when the housing is mounted on the connection carrier.

9. The housing according to claim 8, wherein the first connection conductor and the second connection conductor each have an external contact region projecting from the housing body, wherein electrical contact can be made with the first connection conductor and the second connection conductor by way of the external contact regions or by way of the continuation.

10. The housing according to claim 1, wherein at least one of the connection conductors has a positioning element for an optical element.

11. An optoelectronic semiconductor component comprising a housing according to claim 1, wherein a semiconductor chip is fixed to the first connection conductor.

12. The housing according to claim 1, wherein the leadframe does not have any kinks or bends.

13. The housing according to claim 1, wherein the leadframe of the housing runs within a completely planar main extension plane.

* * * * *